(12) United States Patent
Shibazaki

(10) Patent No.: US 8,421,994 B2
(45) Date of Patent: Apr. 16, 2013

(54) EXPOSURE APPARATUS

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 708 days.

(21) Appl. No.: 12/234,979

(22) Filed: Sep. 22, 2008

(65) Prior Publication Data

US 2009/0086178 A1 Apr. 2, 2009

Related U.S. Application Data

(60) Provisional application No. 60/960,374, filed on Sep. 27, 2007.

(51) Int. Cl.
*G03B 27/42* (2006.01)

(52) U.S. Cl.
USPC .......................................................... 355/53

(58) Field of Classification Search .................... 355/53, 355/69; 385/25, 52
See application file for complete search history.

(56) References Cited

U.S. PATENT DOCUMENTS

| | | | |
|---|---|---|---|
| 4,727,600 A * | 2/1988 | Avakian | 398/126 |
| 5,448,332 A | 9/1995 | Sakakibara et al. | |
| 5,969,441 A | 10/1999 | Loopstra et al. | |
| 6,208,407 B1 | 3/2001 | Loopstra | |
| 6,289,152 B1 | 9/2001 | Zhang et al. | |
| 6,590,634 B1 | 7/2003 | Nishi et al. | |
| 6,611,316 B2 | 8/2003 | Sewell | |
| 6,778,257 B2 | 8/2004 | Bleeker et al. | |
| 6,859,575 B1 * | 2/2005 | Arol et al. | 385/17 |
| 7,023,610 B2 | 4/2006 | Ohtsuki et al. | |
| 7,062,132 B2 * | 6/2006 | Basavanhally et al. | 385/52 |
| 7,190,437 B2 * | 3/2007 | Butler et al. | 355/69 |
| 8,115,906 B2 * | 2/2012 | Shibazaki | 355/72 |
| 2002/0017890 A1 | 2/2002 | Ebihara et al. | |
| 2005/0024621 A1 | 2/2005 | Korenaga | |
| 2005/0140955 A1 * | 6/2005 | Butler et al. | 355/69 |
| 2006/0093272 A1 | 5/2006 | Fenwick et al. | |
| 2006/0182448 A1 * | 8/2006 | Chalfant et al. | 398/131 |
| 2007/0273860 A1 | 11/2007 | Tanaka | |
| 2008/0068568 A1 | 3/2008 | Ebihara et al. | |

FOREIGN PATENT DOCUMENTS

| | | |
|---|---|---|
| JP | A-04-065603 | 3/1992 |
| JP | A-06-283403 | 10/1994 |
| JP | A-10-163099 | 6/1998 |
| JP | A-10-214783 | 8/1998 |

(Continued)

OTHER PUBLICATIONS

Aug. 10, 2009 International Search Report issued in Application No. PCT/JP2008/067778.

(Continued)

*Primary Examiner* — Steven H Whitesell Gordon

(74) *Attorney, Agent, or Firm* — Oliff & Berridge, PLC

(57) ABSTRACT

Electric power is generated by using a generator equipped with: a coil unit that is arranged on a barrel platform and incorporates coils; and a magnet unit that has a magnet section arranged on a protruding section of a column separated from the barrel platform in terms of vibration and generates an electromotive force in a non-contact state with the coils, and a motor that drives the magnet section, and thus a wiring that supplies electric power to the barrel platform does not have to be used. Accordingly, vibration that has been propagated to the barrel platform through the wiring can be precluded.

6 Claims, 5 Drawing Sheets

FOREIGN PATENT DOCUMENTS

| | | |
|---|---|---|
| JP | A-2000-505958 | 5/2000 |
| JP | A-2004-519850 | 7/2004 |
| JP | A-2007-005669 | 1/2007 |
| JP | A-2007-115879 | 5/2007 |
| JP | A-2007-123319 | 5/2007 |
| WO | WO 99/46835 A2 | 9/1999 |
| WO | WO 01/35168 A1 | 5/2001 |
| WO | WO 2004/053955 A1 | 6/2004 |
| WO | WO 2005/074014 A1 | 8/2005 |
| WO | WO 2006/038952 A2 | 4/2006 |
| WO | WO 2007/113955 A1 | 10/2007 |

OTHER PUBLICATIONS

Mar. 27, 2010 Written Opinion of the International Searching Authority issued in Application No. PCT/JP2008/067778.

* cited by examiner

EXPOSURE APPARATUS

CROSS-REFERENCE TO RELATED APPLICATIONS

This non-provisional application claims the benefit of Provisional Application No. 60/960,374 filed Sep. 27, 2007, the disclosure of which is hereby incorporated herein by reference in its entirety.

BACKGROUND OF THE INVENTION

1. Field of the Invention

The present invention relates to exposure apparatuses, and more particularly to an exposure apparatus that exposes an object with an energy beam and forms a pattern on the object.

2. Description of the Background Art

In a lithography process on manufacturing electronic devices (microdevices) such as semiconductor devices and liquid crystal display devices, exposure apparatuses such as a projection exposure apparatus by a step-and-repeat method (a so-called stepper) or a projection exposure apparatus by a step-and-scan method (a so-called scanning stepper (which is also called a scanner) are relatively frequently used.

Meanwhile, because a semiconductor device or the like is formed by overlaying many layers of circuit patterns on a substrate (such as a wafer or a glass plate), it is important that the overlay accuracy between the respective layers is favorable. For example, in the case of the scanner, in order to improve the overlay accuracy, it is important to improve synchronous accuracy between a mask stage holding a mask and a substrate stage holding a substrate.

However, even if the synchronous accuracy between the mask stage and the substrate stage is favorable, it is difficult to improve the overlay accuracy when vibration is propagated from the outside to a projection optical system. Therefore, also in conventional methods, in order to improve position controllability of both the stages and also to suppress the propagation of vibration to the projection optical system, a holding member that holds the projection optical system was supported via a vibration isolation device on a base member installed on a floor surface. Further, recently, in order to preclude the vibration propagated to the projection optical system or the like, an exposure apparatus in which the projection optical system is held by suspension from a body (column) has been proposed (e.g. refer to Kokai (Japanese Unexamined Patent Application Publication) No. 2007-005669).

In this manner, in an exposure apparatus, the holding member that holds a projection optical system and a body that is installed on a floor surface are separated in terms of vibration using a vibration isolation device or the like, but recently the vibration-wise separation of the holding member and the body as is described above has been no longer sufficient, due to finer patterns accompanying higher-integration of semiconductor devices. That is, even if the holding member and the body are separated, as long as wiring for electric power supply or for signal transmission, or piping for coolant supply or the like exists between the holding member and the body, fine vibration from the floor surface is propagated to the projection optical system through the wiring or the piping, and even such fine vibration cannot be ignored now.

SUMMARY OF THE INVENTION

According to a first aspect of the present invention, there is provided a first exposure apparatus that exposes an object with an energy bean and forms a pattern on the object, the apparatus comprising a first member on which a member subject to electric power supply is arranged; a second member that is separated from the first member in terms of vibration; and a moving magnet type generator that has a coil section that is mounted on the first member, a magnet section that faces the coil section via a predetermined clearance, and a drive section that drives the magnet section and is mounted on the second member.

With this apparatus, the coil section of the generator is mounted on the first member on which a member that is subject to electric power supply is arranged, and the drive section that drives the magnet section of the generator is mounted on the second member that is separated from the first member in terms of vibration, and also the magnet section faces the coil section via a predetermined clearance. Therefore, by generating electric power by electromagnetic induction at the coil section by driving the magnet section using the drive section, the electric power can be supplied to a member subject to electric power supply without propagating vibration from the outside to the first member. With this operation, it becomes possible to prevent vibration accompanying the electric power supply such as floor vibration from being propagated, and hence it becomes possible to prevent exposure accuracy from degrading due to the vibration.

According to a second aspect of the present invention, there is provided a second exposure apparatus that exposes an object with an energy beam and forms a pattern on the object, the apparatus comprising: a first member on which a member subject to transmission/reception of an electric signal is arranged; a second member that is separated from the first member in terms of vibration; and a signal transmitting device that includes a first section that is mounted on the first member and transmits and/or receives an electromagnetic wave, and a second section that is mounted on the second member so as to correspond to the first section and receives and/or transmits the electromagnetic wave from/to the first section.

With this apparatus, the first section that transmits and/or receives an electromagnetic wave is mounted on the first member on which a member that is subject to transmission/reception of an electric signal is arranged, and the second section that receives and/or transmits the electromagnetic wave from/to the first section is mounted on the second member that is separated from the first member in terms of vibration. Therefore, in a state of preventing propagation of vibration from the outside to the first member, transmission/reception of the signal can be performed between the member subject to transmission/reception of the electric signal on the first member and an external member. With this operation, it becomes possible to prevent vibration accompanying the signal transmission/reception such as floor vibration from being propagated, and hence it becomes possible to prevent exposure accuracy from degrading due to the vibration.

According to a third aspect of the present invention, there is provided a third exposure apparatus that exposes an object with an energy beam and forms a pattern on the object, the apparatus comprising: a first relay member to which one end of a piping for relay is connected; a second relay member to which the other end of the piping is connected; a first member on which the first relay member is mounted; a second member which is separated from the first member in terms of vibration and on which the second relay member is mounted; and a drive device that drives the second relay member at least in a vertical direction so that relative positions between the first relay member and the second relay member are maintained.

With this apparatus, the first relay member to which one end of a piping for relay is connected is mounted on the first member, and the second relay member to which the other end of the piping for relay is connected is mounted on the second member that is separated from the first member in terms of vibration, and the drive device drives the second relay member at least in a vertical direction so that the relative positions between the first relay member and the second relay member are maintained. Therefore, propagation of the vibration from the outside to the first member via the piping for relay can be effectively suppressed. With this operation, it becomes possible to suppress propagation of vibration caused by existence of the piping such as floor vibration, and hence it becomes possible to prevent exposure accuracy from degrading due to the vibration.

BRIEF DESCRIPTION OF THE DRAWINGS

In the accompanying drawings.

DESCRIPTION OF THE EMBODIMENTS

<First Embodiment>

A first embodiment of the present invention will be described below, with reference to FIGS. 1 and 2.

Figure 1:
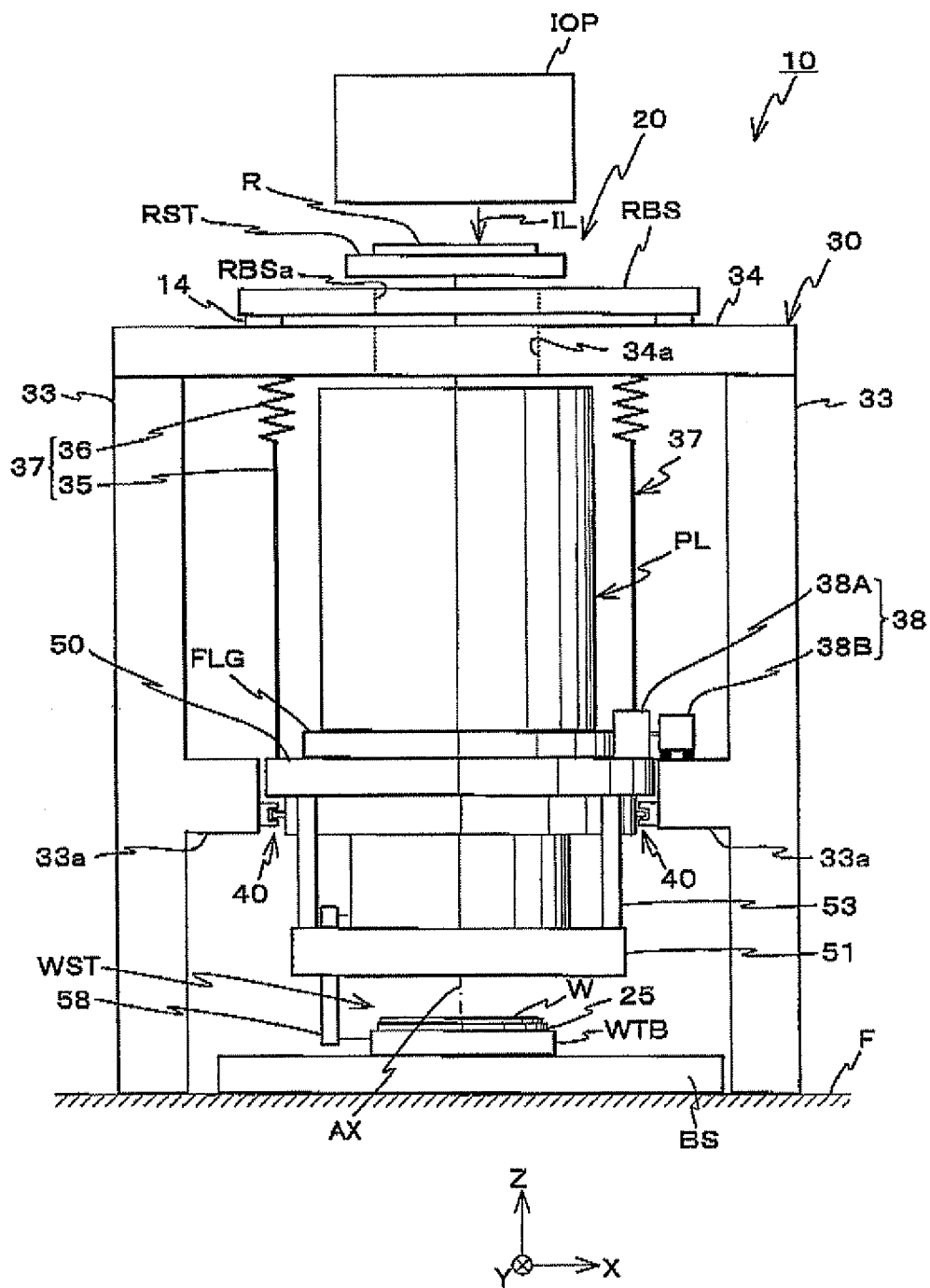
FIG. 1 is a view schematically showing a configuration of an exposure apparatus related to a first embodiment.

FIG. 1 shows a schematic configuration of an exposure apparatus 10 related to the first embodiment. Exposure apparatus 10 is a projection exposure apparatus by a step-and-scan method, which is a so-called scanner. As will be described later, a projection optical system PL is arranged in the embodiment, and the following explanation will be given assuming that a direction parallel to an optical axis AX of projection optical system PL is a Z-axis direction, a direction in which a reticle and a wafer are relatively scanned within a plane orthogonal to the Z-axis direction is a Y-axis direction, and a direction that is orthogonal to a Z-axis and a Y-axis is an X-axis direction, and rotation (tilt), directions about an X-axis, the Y-axis and the Z-axis are θx, θy and θz directions respectively.

Exposure apparatus 10 is equipped with an illumination unit IOP, a reticle stage device 20 including reticle stage RST that holds a reticle R, projection optical system PL, a wafer stage WST that moves in XY two-dimensional directions within an XY plane, holding a wafer W, and their control system, and a column 30 that holds reticle stage device 20 and projection optical system PL, and the like.

Illumination unit IOP includes a light source and an illumination optical system, irradiates an illumination light IL to an illumination area having a rectangular shape or a circular arc shape that is defined by a field stop (which is also called a masking blade or a reticle blind) placed inside illumination unit TOP, and illuminates reticle R on which a circuit pattern is formed with uniform illuminance. In this case, as illumination light IL, a far-ultraviolet light such as a KrF excimer laser light (wavelength: 248 nm), or a vacuum ultraviolet light such as an ArF excimer laser light (wavelength: 193 nm) or an $F_2$ laser light (wavelength: 157 nm) is to be used. Instead of these lights, however, an emission line in an ultraviolet region (such as a g-line having a wavelength of 436 nm, or an i-line having a wavelength of 365 nm) from an extra-high pressure mercury lamp may also be used.

Reticle stage device 20 is placed below illumination unit IOP. As shown in FIG. 1, reticle stage device 20 is equipped with a reticle stage platform RBS supported on a top board section 34 of column 30 via a plurality of (e.g. three in this case) vibration isolation units 14 (however, one vibration isolation unit located in the depth of the page surface is not shown), reticle stage RST placed above reticle stage platform RBS, and a reticle stage drive system (not shown) that drives reticle stage RST. On reticle stage platform RBS, an opening RBS having a rectangular shape in a planar view (when viewed from above) serving as a path of illumination light IL is formed.

Each vibration isolation unit 14 includes a mechanical damper such as an air damper, or a hydraulic damper. With the mechanical damper of vibration isolation unit 14, propagation of relatively high frequency vibration to reticle stage RST can be avoided. Further, between reticle stage platform RBS and top board section 34, six voice coil motors (not shown, a total of three X and Y voice coil motors, and three Z voice coil motors) are arranged. With these six voice coil motors, reticle stage platform RBS can be finely driven in directions of six degrees of freedom of X, Y, Z, θx, θy, and θz. Incidentally, positional information of reticle stage platform RBS is measured by a measurement system (not shown, which includes an interferometer and/or an encoder system, and the like) with projection optical system PL as a reference.

Further, the position (including the θz rotation) of reticle stage RST within the XY plane is measured by a reticle interferometer system (not shown). The measurement values of the measurement system and the reticle interferometer system are supplied to a controller (not shown). The controller controls the position and attitude of reticle stage platform RBS in the directions of six degrees of freedom by controlling the six voice coil motors based on the measurement values of the measurement system. Further, the controller controls the position (including the θz rotation) of reticle stage RST within the XY plane by controlling the reticle stage drive system based on the measurement values of the reticle interferometer system.

As projection optical system PL, in this embodiment, a dioptric system including a plurality of lenses (lens elements) placed along a direction parallel to the Z-axis direction is used. Projection optical system PL is, for example, both-side telecentric and has a predetermined projection magnification β (β is, for example, ¼, or ⅕).

Column 30 is equipped with a plurality of (e.g. three in this case) leg sections 33 (the leg section in the depth of the page surface of FIG. 1 is not shown) whose lower end portions are fixed to a floor surface Fr and top board section 34 that is supported above floor surface F by leg sections 33. An opening 34a having a rectangular shape in a planar view (when viewed from above) is formed in a state of penetrating a center portion of top board section 34 in a vertical direction (the Z-axis direction). Opening 34a corresponds to opening RBSa.

A barrel platform (a main frame) 50 is supported by suspension from top board section 34 of column 30 by three suspension support mechanisms 37 (however, the suspension support mechanism in the depth of the page surface of FIG. 1 is not shown). In an opening (not shown) formed in barrel platform 50, projection optical system PL is inserted from above. At a position slightly lower than the center in a height direction of a barrel of projection optical system PL, a flange FLG is arranged, and projection optical system PL is supported from below by barrel platform 50 via flange FLG. Barrel platform 50 is composed of a stepped cylindrical member whose lower half section has a smaller diameter compared with a diameter of its upper half section.

Each of suspension support mechanisms 37 includes a coil spring 36 that is a connecting member having a flexible structure and a wire 35. Since coil spring 36 vibrates like a pendulum in a direction perpendicular to optical axis AX of projection optical system PL, coil spring 36 has a vibration-free function (a function of preventing vibration of the floor from travelling to projection optical system PL) in the direction perpendicular to optical axis AX. Further, coil spring 36 has a high vibration-free function also in a direction parallel to optical axis AX.

In the vicinity of a center portion in the Z-axis direction of each of three leg sections 33 of column 30, a protruding section 33a is formed. Between each protruding section 33a and a smaller diameter section of barrel platform 50, a drive mechanism 40 is arranged. Each drive mechanism 40 includes a voice coil motor that drives projection optical system PL in a radius direction of the barrel, and a voice coil motor that drives projection optical system PL in an optical axis AX direction (the Z-axis direction). Accordingly, with three drive mechanisms 40, projection optical system PL can be moved in the directions of six degrees of freedom.

On barrel platform 50 (or on flange FLG of projection optical system PL), an acceleration sensor (not shown) used to detect the acceleration of projection optical system PL in the directions of six degrees of freedom is arranged, and based on acceleration information detected by the acceleration sensor, a controller (not shown) controls the two voice coil motors of each drive mechanism 40 so that projection optical system PL is in a static state with respect to column 30 and floor surface F.

From a lower surface of barrel platform 50, a measurement mount 51 having a ring shape is supported by suspension via three support members 53 (however, the support member in the depth of the page surface is not shown). In actuality, three support members 53 are each configured including a link member, which has a flexure section at its both end portions that is capable of being displaced in directions of five degrees of freedom other than a longitudinal direction of support member 53, and three support members 53 can support measurement mount 51 with little reaction force generated between measurement mount 51 and barrel platform 50.

On measurement mount 51, a wafer interferometer 58, an alignment system (not shown), a multipoint focal position detecting system (not shown), and the like are held. The measurement values of wafer interferometer 58, the alignment system, and the multipoint focal position detecting system are supplied to a controller (not shown). As the alignment system, a sensor by an image processing method that is disclosed in, for example, Kokai (Japanese Unexamined Patent Application Publication) No. 04-065603 and the like can be used. Further, as the multipoint focal position detecting system, a multipoint focal position detecting system that is disclosed in, for example, Kokai (Japanese Unexamined Patent Application Publication) No. 06-283403 (the corresponding U.S. Pat. No. 5,448,332) and the like can be used.

Between protruding section 33a on the +X side of column 30 and barrel platform 50 facing the protruding section 33a, a moving magnet type generator 38 is arranged that supplies electric power (electric source current) to various actuators or various sensors arranged in each of barrel platform 50 (including measurement mount 51) and projection optical system PL. In this case, generator 38 is used as an electric source used to charge an AC electric source and/or a battery (not shown) arranged on barrel platform 50.

Figure 2:
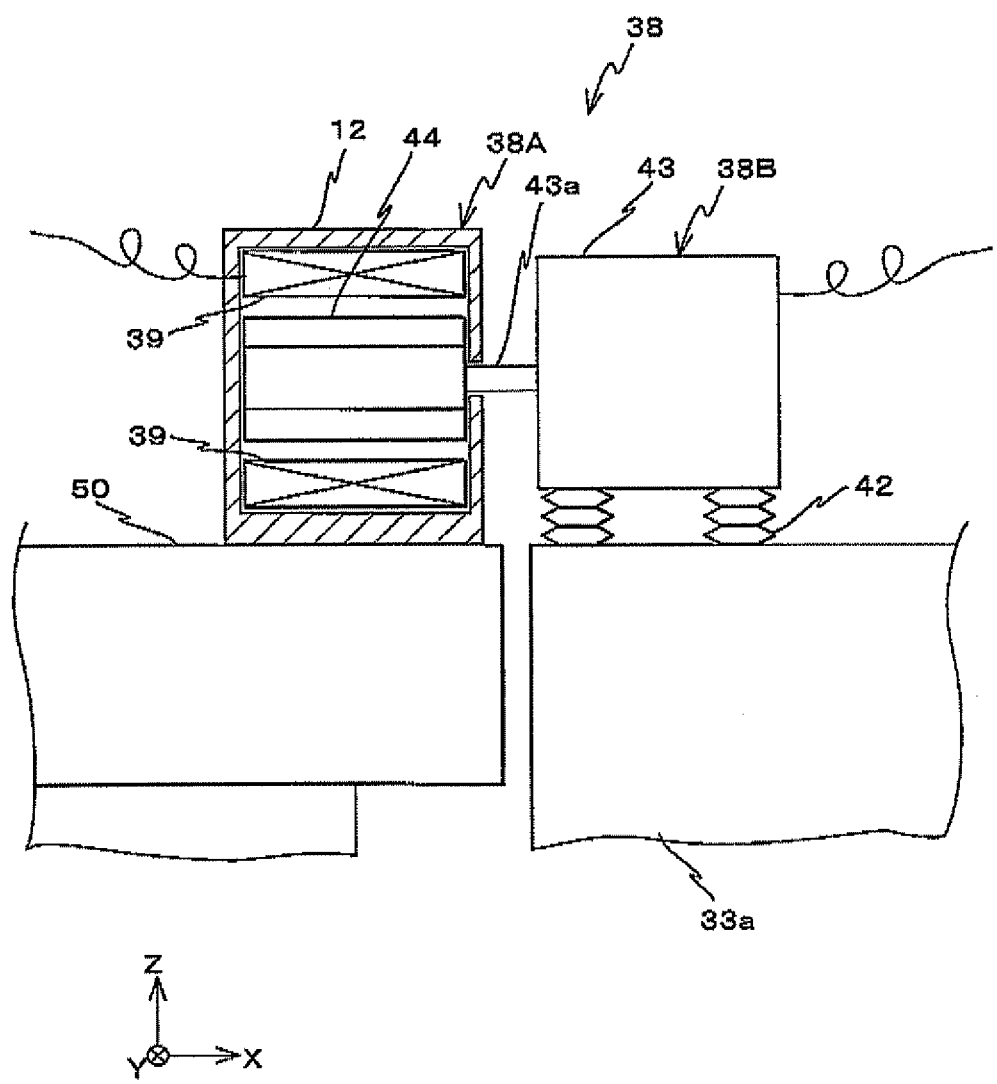
FIG. 2 is a view showing a generator that is used in the espouser apparatus related to the first embodiment.

As shown in FIG. 2, generator 38 is equipped with a coil unit 38A fixed on barrel platform 50 and a magnet unit 38B installed on protruding section 33a via a plurality of vibration isolation units 42. Coil unit 38A has a housing 12 fixed on barrel platform 50 and at least one pair of coils 39 housed inside housing 12. Magnet unit 38B has a magnet section 44 having a permanent magnet that faces coils 39 via a predetermined clearance and an electrical motor (motor) 43 having a rotation axis 43a on a tip of which magnet section 44 is fixed. The tip of rotation axis 43a of motor 43 is inserted into housing 12 via a circular hole formed on a side wall of housing 12 on the +X side, and magnet section 44 is attached to its tip portion. In this case, magnet section 44 and coils 39 are in a noncontact state, and housing 12 and rotation axis 43a are also in a noncontact state.

With generator 38 having the configuration described above, when the controller (not shown) drives motor 43, magnet section 44 attached to rotation axis 43a rotates, which generates an electromotive force by electromagnetic induction at coils 39. Accordingly, in the case when generator 38 is used as the AC electric source, this electric source drives the actuators (not shown) and the like. Further, in the case when generator 38 is used as an electric source for charging the battery, charging of the battery is performed and also the electric current from the battery is supplied to, for example, the sensors and the like.

In this case, coil unit 38A of generator 38 is mounted on barrel platform 50 on which the battery, the sensors, the actuators and the like that are subject to electric power supply are arranged, and motor 43 (magnet unit 38B) that drives magnet section 44 of generator 38 is mounted on protruding section 33a of column 30 that is separated from barrel platform 4D in terms of vibration, and also coil unit 38A is in a noncontact state with magnet section 44 and rotation axis 43a. Therefore, the electric power can be supplied to each member described above that is subject to electric power supply without propagating outside vibration (such as floor vibration) to barrel platform 50 via column 30.

Further, since motor 43 is installed on protruding section 33a via a plurality of vibration isolation units 42, there is no possibility that vibration generated from protruding section 33a when driving motor 43 becomes a factor for vibration of projection optical system PL through other sections of column 30 (e.g. top board 34).

Referring back to FIG. 1, wafer stage WST is supported by levitation above the upper surface of stage platform BS that is horizontally placed below projection optical system PL, via an air bearing arranged on the bottom surface of wafer stage WST.

In this case, stage platform BS is directly installed on floor surface F, and the surface on the +Z side (the upper surface) is processed so that its flatness is so high to serve as a movement reference surface (a guide surface) of water stage WST.

Wafer stage WST is equipped with a wafer table WTB that is supported by levitation above the upper surface of stage platform BS, and a wafer holder 25 that is mounted on wafer table WTB and holds wafer W by vacuum suction or the like. Wafer stage WST is freely drivable within the XY plane along the upper surface of stage platform BS by a wafer stage drive system including a linear motor or the like. The wafer stage drive system is controlled by the controller based on the measurement values of interferometer 58.

In exposure apparatus 10 having the configuration described above, as is described previously, when the illumination area on reticle R is illuminated by illumination light IL from illumination unit IOP, illumination light IL having passed through reticle R whose pattern surface is placed so as to conform to a first plane (an object plane) of projection optical system PL forms a reduced image of a circuit pattern (a projected image of part of the circuit pattern) of reticle R within the illumination area, on an area (an exposure area) that is conjugate with the illumination area on wafer W which is placed on the second plane (image plane) side of projection optical system PL and whose surface is coated with a resist (a sensitive agent), via projection optical system Pt.

Then, by relatively moving reticle R in a scanning direction (the Y-axis direction) with respect to the illumination area (illumination light IL) and also relatively moving wafer W in the scanning direction (the Y-axis direction) with respect to the exposure area (illumination light IL) by synchronous drive of reticle stage RST and wafer stage WST, scanning exposure of one shot area (divided area) on wafer W is performed, and a pattern of reticle R is transferred to the shot area. That is, in this embodiment, the pattern is generated on wafer W by illumination unit IOP, reticle R and projection optical system PL, and the pattern is formed on wafer W by exposure of a sensitive layer (a resist layer) on wafer W by illumination light IL.

Further, during the scanning exposure described above, the controller drives wafer stage WST based on the measurement values of the multipoint focal position detecting system, and performs focus-leveling control in which the surface of wafer W is conformed within a depth of focus of projection optical system PL.

As is described above, in exposure apparatus 10 of the embodiment, coil unit 38A of generator 38 is mounted on barrel platform 50 on which the battery, the sensors, the actuators and the like that are subject to electric power supply are arranged, and motor 43 (magnet unit 38B) that drives magnet section 44 of generator 38 is mounted on protruding section 33a of column 30 that is separated from barrel platform 50 in terms of vibration. Therefore, the electric power can be supplied to the respective members subject to electric power supply described above without propagating outside vibration (such as floor vibration) to barrel platform 50 via column 30.

The members that are subject to electric power supply from generator 38 include, for example, an actuator that drives a movable lens constituting part of projection optical system PL, wafer interferometer 58 held on measurement mount 51, the alignment system (not shown), the multipoint focal position detecting system (not shown), and the like.

Accordingly, the electric power supply to these sections can be smoothly performed without propagating the floor vibration and the like to projection optical system PL, which makes it possible to prevent exposure accuracy from degrading and perform high-precision exposure.

Incidentally, in the embodiment above, the case has been explained where generator 38 is arranged between barrel platform 50 that holds projection optical system PL and column 30, but the present invention is not limited thereto, and the foregoing separation placement of the respective sections (coil unit 38A, magnet unit 38B) constituting the above-described generator can be suitably applied without change, to the case where there are two members that constitute part of the exposure apparatus respectively and are vibration-wise separated, and electric power is supplied from the outside to a member subject to electric power supply that is arranged on one of the members, and further, floor vibration and the like should not be propagated to the one of the members via the other of the members.

Further, in the embodiment above, the case has been explained where generator 38 is arranged between barrel platform 50 that holds projection optical system PL and column 30. However, the present invention is not limited thereto, and if there are two members that constitute part of the exposure apparatus respectively and are separated in terms of vibration, and electric power is supplied from the outside to a member subject to electric power supply that is arranged on one of the two members, then, for example, an element (such as a solar battery) that generates electric power by receiving a light may be arranged on the one of the two members and illumination light IL from the light source may be guided to the element using an optical fiber whose one end is connected to the other member of the two members.

Besides the forgoing configuration, as is disclosed in, for example, the pamphlet of International Publication No. 2007/113955 and the like, a transmitting section and a receiving section that transmits/receives electric power in a noncontact manner may be arranged on a first member and a second member, respectively.

<Second Embodiment>

Next, a second embodiment of the present invention will be explained. An exposure apparatus related to the second embodiment has an entire configuration similar to that of the first embodiment described above, but is different from the first embodiment in a point that instead of generator 38r an optical communication mechanism 70 shown FIG. 3 that transmits/receives signals (information) by optical communication is separately placed between barrel platform 50 and protruding section 33a of column 30. Accordingly, optical communication mechanism 70 will be described below.

Figure 3:
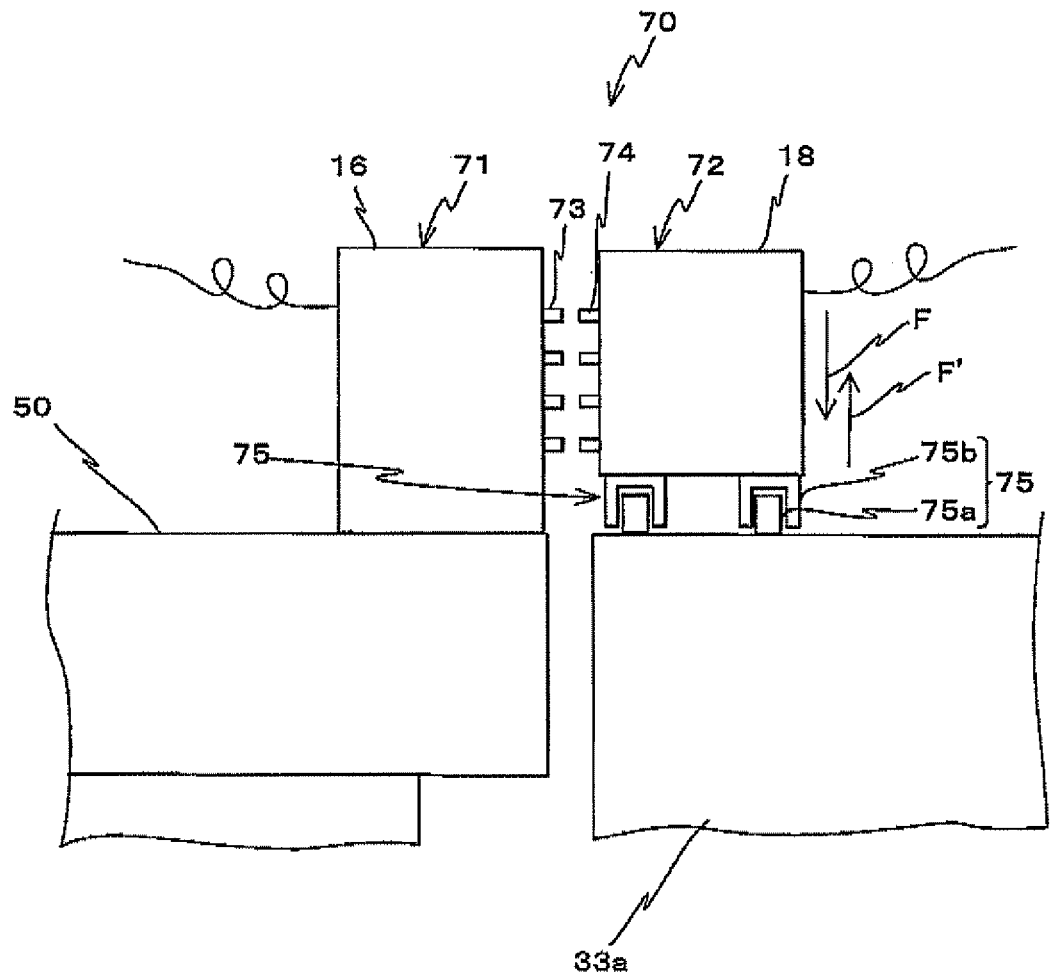
FIG. 3 is a view showing an optical communication mechanism that is used in an exposure apparatus related to a second embodiment.

Optical communication mechanism 70 is equipped with a first optical communication unit 71 fixed on barrel platform 50, and a second optical communication unit 72 mounted on protruding section 33a via a self-weight support mechanism (not shown) and a plurality of, for example, four voice coil motors 75 (the voice coil motors in the depth of the page surface are not shown in FIG. 3) so as to face first optical communication unit 71.

First optical communication unit 71 is equipped with a housing 16, and a plurality of optical fibers 73 attached in a state where one ends of optical fibers 73 are respectively exposed from the end surface on the +X side of housing 16 in FIG. 3. The other end portions of some optical fibers 73 out of a plurality of optical fibers 73 are connected to a photoelectric conversion section including many photoelectric conversion elements housed in housing 16. Further, the other end portions of the remaining optical fibers 73 out of a plurality of optical fibers 73 are connected to a conversion section that includes many light-emitting elements housed in housing 16, a drive circuit of the light-emitting elements and the like, and converts electric signals into optical signals.

Second optical communication unit 72 is equipped with a housing 18, and a plurality of optical fibers 74 attached in a state where one ends of optical fibers 74 are respectively exposed from the end surface on the −X side of housing 18 in FIG. 3. Each of a plurality of optical fibers 74 is placed so as to face each of optical fibers 73 one by one. The other end portions of some optical fibers 74 out of a plurality of optical fibers 74 are connected to a conversion section that includes many light-emitting elements housed in housing 18 a drive circuit of the light-emitting elements and the like, and converts electric signals into optical signals. Further, the other end portions of the remaining optical fibers 74 out of a plurality of optical fibers 74 are connected to a photoelectric conversion section that includes many photoelectric conversion elements housed in housing 18.

Each of four voice coil motors 75 has a magnet unit 75b fixed to the bottom surface of housing 18 and an armature unit (coil unit) 75a fixed to the upper surface of protruding section 33a. Each voice coil motor 75 drives second optical communication unit 72 in the Z-axis direction as indicated by arrows F and F'.

Further, first optical communication unit 71 and second optical communication unit 72 are connected via a flexure mechanism (not shown) whose stiffness in the Z-direction is lower than that in other directions. With this flexure mechanism, movement in the Y-axis direction and inclination of second optical communication unit 72 are restrained.

Furthermore, on the surface on the +X side of first optical communication unit 71, a reflective grating (not shown) having a periodic direction in the Z-axis direction is placed. Facing this grating, an encoder head (not shown) is placed on the surface on the −X side of second optical communication unit 72. The measurement resolution of an encoder constituted by the grating and the encoder head is not more than 1 μm. The measurement values of this encoder are supplied to a controller (not shown), and the controller controls voice coil motor 75 to drive second optical communication unit 72 in the Z-axis direction so that each optical fiber 73 faces each optical fiber 74, that is, the relative positions of each optical fiber 73 and each optical fiber 74 within the facing plane (YZ plane) is maintained.

With optical communication mechanism 70 having the configuration described above, optical communication via optical fibers 73 and 74 that are respectively equipped in first and second optical communication units 71 and 72, allows signals to be transmitted and received between an external instrument (e.g. a controller) connected to second optical communication unit 72 and various sensors or various actuators or the like arranged in each of barrel platform 50 (including measurement mount 51) and projection optical system PL connected to first optical communication unit 71 via a signal line.

Further, in optical communication mechanism 70, first optical communication unit 71 is mounted on barrel platform 50 and second optical communication unit 72 is mounted on protruding section 33a of column 30 that is separated from barrel platform 50 in terms of vibration, and therefore transmission/reception of signals with respect to the respective sections described above can smoothly be performed without propagating floor vibration and the like to projection optical system PL, which makes it possible to prevent exposure accuracy from degrading and perform high-precision exposure.

Incidentally, in the embodiment above, the case has been explained where reception and transmission of signals are performed between first optical communication unit 71 and second optical communication unit 72, but the present invention is not limited thereto, and first optical communication unit 71 may be used for transmitting only (or receiving only), and second optical communication unit 72 may be used for receiving only (or transmitting only).

Figure 4:
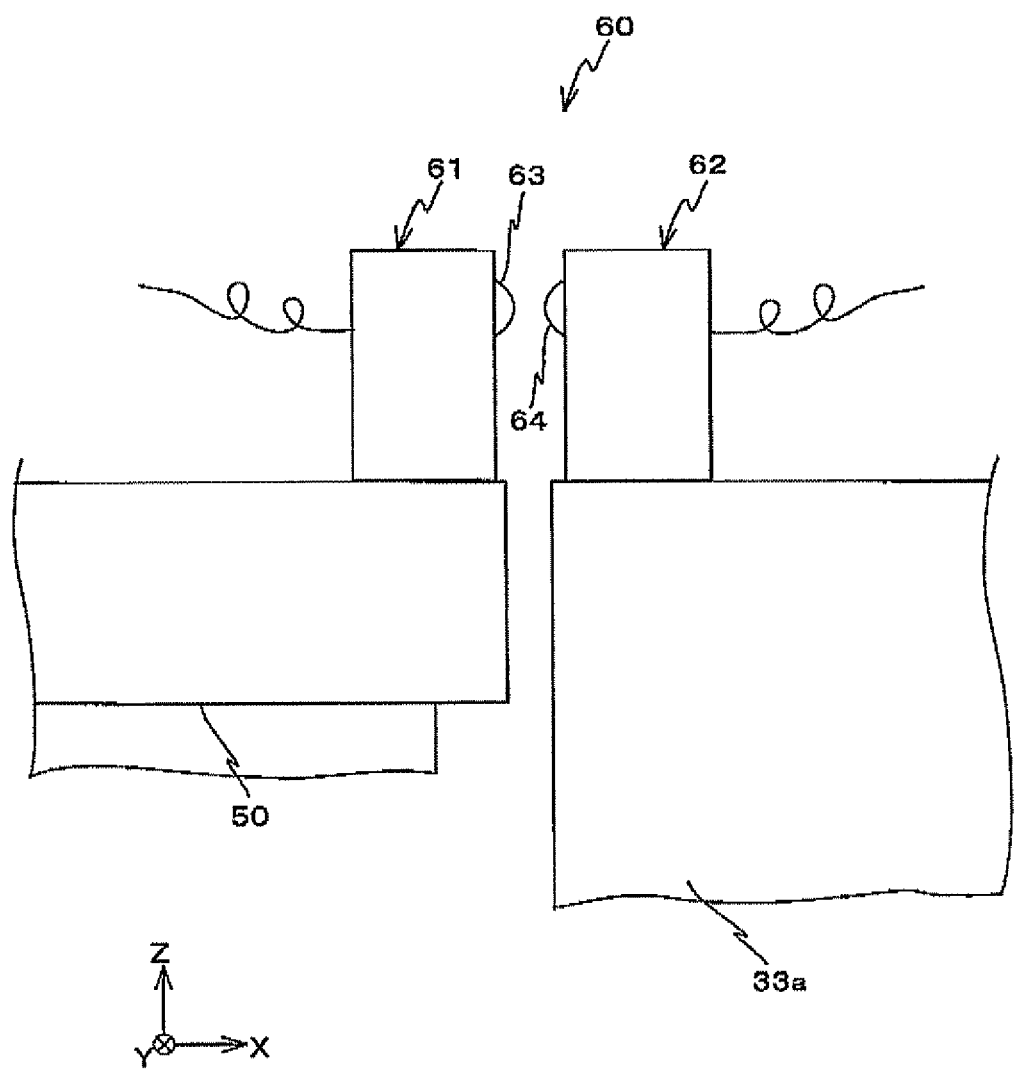
FIG. 4 is a view showing an infrared communication mechanism related to a modified example of the second embodiment.

Incidentally, instead of optical communication mechanism 70 in the second embodiment above, an infrared communication mechanism 60 shown in FIG. 4 may be arranged Infrared communication mechanism 60 is equipped with a first infrared sending/receiving unit 61 arranged on barrel platform 50 and having a first sending/receiving section 63 that sends/receives infrared rays, and a second infrared sending/receiving unit 62 arranged on protruding section 33a and having a second sending/receiving section 64 that sends/receives infrared rays.

With infrared communication mechanism 60 having the configuration described above, it becomes possible to perform communication (reception/transmission) of signals (information) between infrared sending/receiving unit 61 and infrared sending/receiving unit 62 in a state where vibration propagated to column 30 (protruding section 33a) is precluded, which makes it possible to prevent exposure accuracy from degrading due to the vibration and to perform high-precision exposure. Incidentally, the signal communication using infrared communication mechanism 60 is suitable for the cases such as when a communication speed may be slow, when the signal is small in quantity, or when communication that does not require synchronization of communication is performed. In the other cases, it is desirable to use optical communication mechanism 70 or the like that can perform high-speed communication compared with infrared communication mechanism 60.

Incidentally, information may also be received/transmitted using a wireless RAN, instead of infrared communication mechanism 60.

Incidentally, in the second embodiment and its modified example described above, the case has been explained where optical communication mechanism 70 or infrared communication mechanism 60 is arranged respectively between barrel platform 50 that holds projection optical system PL and column 30, but the present invention is not limited thereto, and the foregoing separation placement of the respective sections (first and second optical communication units 71 and 72) constituting optical communication mechanism 70 and the respective sections (first and second infrared sending/receiving units 61 and 62) constituting infrared communication mechanism 60 can be suitably applied without change, to the case where there are two members that constitute part of the exposure apparatus respectively and are vibration-wise separated, and transmission of signals is performed between a member that is subject to transmission/reception of electric signals arranged on one of the members and an external member, and further, floor vibration and the like should not be propagated to the one of the members via the other of the members.

<Third Embodiment>

Figure 5:
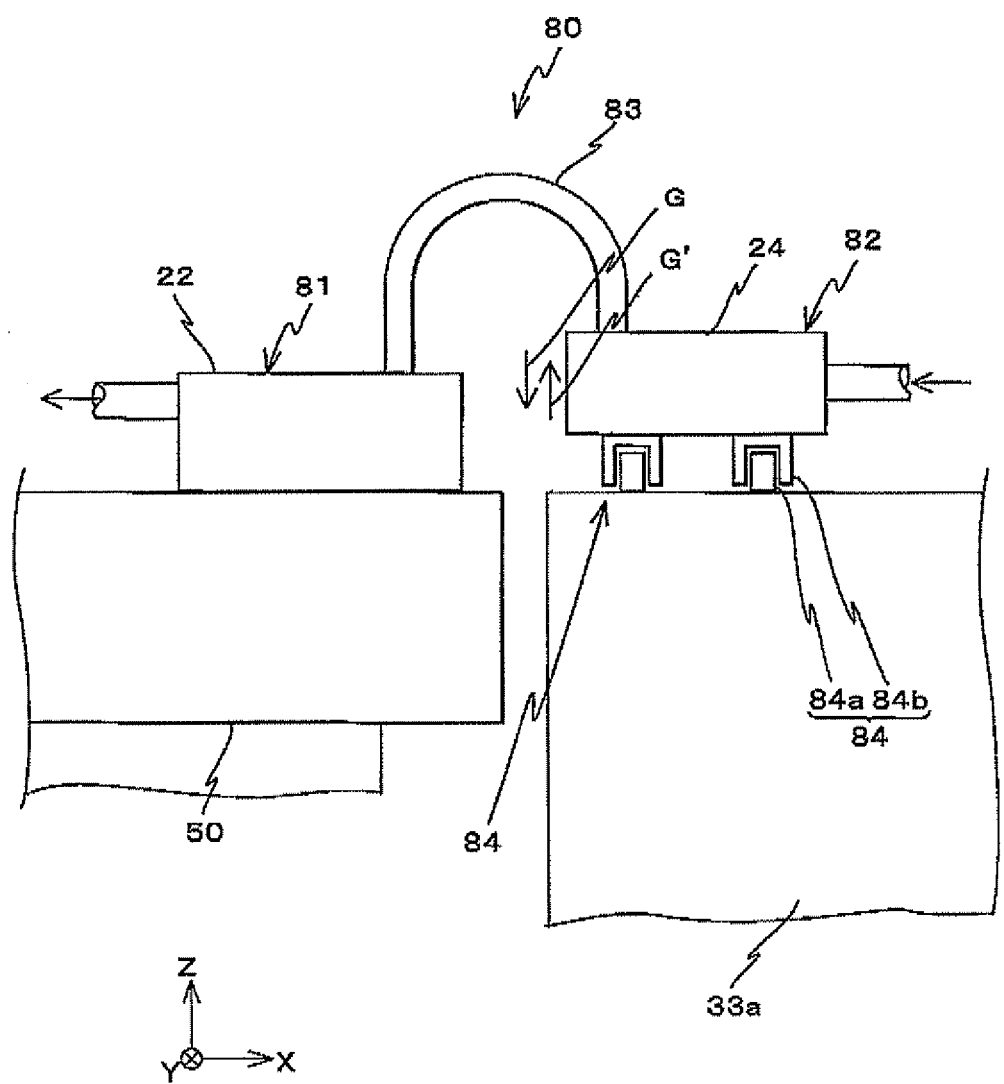
FIG. 5 is a view showing a piping mechanism that is used in an exposure apparatus related to a third embodiment.

Next, a third embodiment of the present invention will be explained. An exposure apparatus related to the third embodiment has an entire configuration similar to that of the first embodiment described above, but is different from the first embodiment in a point that instead of generator 38, a piping relay mechanism 80 shown in FIG. 5 is separately placed between barrel platform 50 and protruding section 33a of column 30. Accordingly, piping relay mechanism 80 will be described below.

Piping relay mechanism 80 is equipped with a first piping unit 81 fixed on barrel platform 50, and a second piping unit 82 mounted on protruding section 33a via a self-weight support mechanism (not shown) and a plurality of, for example, four voice coil motors 84 (the voice coil motors in the depth of the page surface are not shown in FIG. 5). First piping unit 81 has a housing 22 inside of which a manifold path is arranged. One end of a piping for relay 83 is connected to first piping unit 81, and the other end of piping 83 is connected to second piping unit 82. Piping 83 is a piping for supply and recovery of coolant used to cool each heating section of various actuators arranged on barrel platform 50 (including measurement mount 51), projection optical system PL held by barrel platform 50, and the like. Accordingly, as piping 83r a piping made up of at least two conduits bundled, which are a conduit for supplying coolant and a conduit for recovering coolant, or a single piping in which a path for supplying coolant and a path for recovering coolant are formed is used. As piping 83, a piping made of a flexible material is used.

Second piping unit 82 has a housing 24 inside of which a plurality of rooms are formed, and is connected to an external supply device (not shown) or the like for supplying coolant via a piping system.

Each of four voice coil motors 84 has a magnet unit 84b fixed to the bottom surface of housing 24 and an armature unit (coil unit) 84a fixed to the upper surface of protruding section 33a. Each voice coil motor 84 drives second piping unit 82 in the Z-axis direction as indicated by arrows G and G'.

Between first and second piping units 81 and 82, a measurement device (not shown) that measures a relative positional deviation (mainly in the Z-axis direction) between both the piping units is arranged. As the measurement device as well, the encoder described earlier can be used. The measurement values of the measurement device are supplied to a controller (not shown) and the controller drives second piping unit 82 in the Z-axis direction by controlling voice coil motors 84 so that a positional relation in the Z-axis direction between first and second piping units 81 and 82 is maintained. With this operation, a tension (tensile force) acting on piping 83 that is defined by a product of spring stiffness of piping 83 and a relative displacement in the Z-axis direction between first and second piping units 81 and 82 can substantially be zero. Incidentally, movement in the Y-axis direction and inclination of second piping unit 82 may be restrained, alternatively, by using a flexure mechanism similar to the one described previously.

With piping relay mechanism 80 having the configuration described above, first piping unit 81 to which one end of piping 83 is connected is mounted on barrel platform 50, and second piping unit 82 to which the other end of piping 83 is connected is mounted on a protruding section 33a of column 30 that is separated from barrel platform 50 in terms of vibration, and in addition, voice coil motors 84 controlled by the controller drives second piping unit 82 at least in the Z-axis direction (a gravity direction, a vertical direction) so that the relative positions between first and second piping units 81 and 82 are maintained. With this operation, a tensile force acting on piping 83 can substantially be zero, and it becomes possible to effectively suppress propagation of outside vibration (such as floor vibration) from the side of protruding section 33a of column 30 to the side of barrel platform 50 via piping 83, and hence it becomes possible to prevent exposure accuracy from degrading due to the vibration and to perform high-precision exposure.

Incidentally, in the third embodiment above, the case has been explained where the exposure apparatus is equipped with piping relay mechanism 80 used for supply and recovery of coolant, but the present invention is not limited thereto, and a piping mechanism for supplying coolant only and a piping mechanism for recovering coolant only, which are similar to piping relay mechanism 80, may be separately arranged. In this case, as the piping for relay, a piping for supplying coolant only and a piping for recovering coolant only are severally arranged.

Incidentally, in the third embodiment above, the case has been explained where piping relay mechanism 80 is arranged between barrel platform 50 that holds projection optical system PL and column 30, but the present invention is not limited thereto, and the foregoing separation placement of the respective sections (first and second piping units 81 and 82) constituting piping relay mechanism 80 can be suitably applied without change, to the case where there are two members that constitute part of the exposure apparatus respectively and are vibration-wise separated, and one end of a piping for relay needs to be connected to a member arranged on one of the members and the other end of the piping needs to be a member mounted on the other of the members, and further, floor vibration and the like should not be propagated to the one of the members via the other of the members.

Further, in the third embodiment above, the case has been explained where a piping for supply and recovery of coolant is used as piping for relay 83, but the present invention is not limited thereto, and either of a piping for gas or a piping for vacuum may be used. In such a case, by using a piping mechanism similar to piping relay mechanism 80, it becomes possible to effectively suppress propagation of vibration caused by existence of the piping such as floor vibration, and hence it becomes possible to prevent exposure accuracy from degrading due to the vibration.

The piping for gas can be used, for example, in the cases such as when inert gas such as helium gas is supplied into a barrel of projection optical system PL, or when a pressurized gas is supplied to a static gas bearing used for each stage or other constituents. Further, in the case when a vacuum chuck or a static gas bearing on each stage is a vacuum preload type bearing, the piping for vacuum is used for supplying vacuum to the bearing.

Further, in the first to third embodiments above, the case has been explained where the present invention is applied to the exposure apparatus in which projection optical system PL is supported by suspension from column 30, but the present invention is not limited thereto, and the configuration in which: coil unit 38A and magnet unit 38B of generator 38; first optical communication unit 71 and second optical communication unit 72 of optical communication mechanism 70 (or first infrared communication unit 61 and second infrared communication unit 62 of infrared communication mechanism 60); or first piping unit 81 and second piping unit 82 of piping relay mechanism 80 are separately placed on different members, similarly to the respective embodiments above, can also be employed in an exposure apparatus in which a body that holds a projection optical system is held above a base member (which is also called a frame caster) via a vibration isolation unit, and the equivalent effect can be obtained, although a shape of the base member needs to be devised.

Incidentally, an arbitrary combination of generator 38, optical communication mechanism 70, piping relay mechanism 80, and infrared communication mechanism 60, which have been explained in the first to third embodiments and the modified example of the second embodiment, may be employed in the same exposure apparatus.

Incidentally, in each of the above embodiments, the case has been explained where the present invention is applied to a scanning exposure apparatus by a step-and-scan method or the like, but the present invention is not limited thereto, and the present invention may be applied to a static exposure apparatus such as a stepper. Moreover, the present invention can also be applied to a multi-stage type exposure apparatus equipped with a plurality of wafer stages, as is disclosed in, for example, Kokai (Japanese Unexamined Patent Application Publications) No. 10-163099 and No. 10-214783 (the corresponding U.S. Pat. No. 6,590,634), Kohyo (published Japanese translation of International Publication for Patent Application) No. 2000-505958 (the corresponding U.S. Pat. No. 5,969,441), the U.S. Pat. No. 6,208,407, and the like, or to an exposure apparatus that is equipped with a wafer stage and a measurement stage as is disclosed in, for example, the pamphlet of International Publication No. 2005/074014 and the like.

Besides, the present invention can also be applied to a liquid immersion exposure apparatus that is disclosed in the pamphlet of International Publication No. 2004/53955 and the like. In this case, liquid used in liquid immersion exposure may also be supplied and recovered using piping relay mechanism 80 in the third embodiment above.

Further, the projection optical system in the exposure apparatus in each of the above embodiments may be not only a reduction system, but also may be either of an equal magnifying system or a magnifying system, and the projection optical system may be not only a dioptric system but also may be either of a catoptric system or a catadioptric system, and its projected image may be either of an inverted image or an upright image.

Further, in the case when a far-ultraviolet light or a vacuum ultraviolet light is used as illumination light IL, as is disclosed in, for example, the pamphlet of International Publication No. 1999/46835 (the corresponding U.S. Pat. No. 7,023,610), a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytterbium), and by converting the wavelength into ultraviolet light using a nonlinear optical Crystal, may also be used.

Further, in the embodiments above, illumination light IL of the exposure apparatus is not limited to the light having a wavelength more than or equal to 100 nm, and it is needless to say that the light having a wavelength less than 100 nm may be used. For example, in recent years, in order to expose a pattern less than or equal to 70 nm, an EUV exposure apparatus that makes an SOR or a plasma laser as a light source generate an EUV (Extreme Ultraviolet) light in a soft X-ray range (e.g. a wavelength range from 5 to 15 nm), and uses a total reflection reduction optical system designed under the exposure wavelength (e.g. 13.5 nm) and the reflective mask has been developed. In the EUV exposure apparatus, the arrangement in which scanning exposure is performed by synchronously scanning a mask and a wafer using a circular arc illumination can be considered, and therefore, the present invention can also be suitably applied to such an exposure apparatus. Besides, the present invention can also be applied to an exposure apparatus that uses charged particle beams such as an electron beam or an ion beam.

Further, in the embodiments above, a light transmissive type mask (reticle), which is a light transmissive substrate on which a predetermined light shielding pattern (or a phase pattern or a light attenuation pattern) is formed, is used. Instead of this reticle, however, as is disclosed in, for example, U.S. Pat. No. 6,778,257, an electron mask (which is also called a variable shaped mask, and includes, for example, a DMD (Digital Micromirror Device) that is a type of a non-emission type image display device (a spatial light modulator) or the like) on which a light-transmitting pattern, a reflection pattern, or an emission pattern is formed according to electronic data of the pattern that is to be exposed may also be used.

Further, as is disclosed in, for example, the pamphlet of International Publication No. 2001/035168, the present invention can also be applied to an exposure apparatus (a lithography system) that forms line-and-space patterns on a wafer by forming interference fringes on the wafer.

Moreover, as is disclosed in for example, Kohyo (published Japanese translation of International Publication for Patent Application) No. 2004-519850 (the corresponding U.S. Pat. No. 6,611,316), the present invention can also be applied to an exposure apparatus that synthesizes two reticle patterns on a wafer via a projection optical system and almost simultaneously performs double exposure of one shot area on the wafer by one scanning exposure.

Incidentally, an object on which a pattern should be formed (an object subject to exposure to which an energy beam is irradiated) in the embodiments above is not be limited to a wafer, and may also be other objects such as a glass plate, a ceramic substrate, or a mask blank.

Further, the exposure apparatus in the embodiments above is manufactured by assembling various subsystems, which include the respective constituents that are recited in the claims of the present application, so as to keep predetermined mechanical accuracy, electrical accuracy and optical accuracy. In order to secure these various kinds of accuracy, before and after the assembly, adjustment to achieve the optical accuracy for various optical systems, adjustment to achieve the mechanical accuracy for various mechanical systems, and adjustment to achieve the electrical accuracy for various electric systems are performed. A process of assembling various subsystems into the exposure apparatus includes mechanical connection, wiring connection of electric circuits, piping connection of pressure circuits, and the like among various types of subsystems. Needless to say, an assembly process of individual subsystem is performed before the process of assembling the various subsystems into the exposure apparatus. When the process of assembling the various subsystems into the exposure apparatus is completed, a total adjustment is performed and various kinds of accuracy as the entire exposure apparatus are secured. Incidentally, the making of the exposure apparatus is preferably performed in a clean room where the temperature, the degree of cleanliness and the like are controlled.

Semiconductor devices are manufactured through the following steps: a step where the function/performance design of a device is performed; a step where a reticle based on the design step is manufactured; a step where a wafer is manufactured using materials such as silicon; a lithography step where a pattern of the reticle (the mask) is transferred onto the wafer by the exposure apparatus (the pattern formation apparatus) of the embodiments described earlier; a development step where the exposed wafer is developed; an etching step where an exposed member of an area other than the area where resist remains is removed by etching; a resist removing step where the resist that is no longer necessary when the etching is completed is removed, a device assembly step (including a dicing process, a bonding process, and a packaging process); an inspection step; and the like. In this case, in the lithography step, device patterns are formed on the wafer using the exposure apparatus of the embodiment described above, and therefore, productivity of highly-integrated devices can be improved.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus that exposes an object with an energy beam and forms a pattern on the object, the apparatus comprising:
   a first member on which a member subject to transmission/reception of an electric signal is arranged;
   a second member that is separated from the first member in terms of vibration, the first member and the second member being placed in the exposure apparatus facing each other via a first gap;
   a signal transmitting device that includes a first section that is mounted on the first member and transmits and/or receives an electromagnetic wave, and a second section that is mounted on the second member so as to correspond to the first section and receives and/or transmits the electromagnetic wave from/to the first section, the first section and the second section respectively include optical fibers that are placed facing each other via a second gap that is substantially the same as or smaller than the first gap; and
   a drive system that drives the second section at least in a vertical direction so that relative positions of the optical fiber of the first section and the optical fiber of the second section within a facing plane are maintained.

2. The exposure apparatus according to claim 1, wherein the drive system includes a measurement system that measures the relative positions.

3. The exposure apparatus according to claim 1, wherein the first section and the second section are connected via a flexure mechanism whose stiffness in the vertical direction is lower than that in other directions.

4. The exposure apparatus according to claim 1, further comprising:
   an optical system through which the energy beam goes when forming the pattern, wherein the optical system is held by the first member.

5. The exposure apparatus according to claim 4, wherein the member subject to transmission/reception of the electric signal includes a member pertaining to the optical system.

6. The exposure apparatus according to claim 1, wherein the member subject to transmission/reception of the electric signal includes at least one of a sensor and an actuator.

* * * * *